United States Patent
Nakanishi et al.

(10) Patent No.: US 6,432,474 B1
(45) Date of Patent: Aug. 13, 2002

(54) THIN FILM OF PEROVSKITE TYPE MANGANESE OXIDE PROCESS FOR PRODUCING THE SAME THIN FILM AND AN INFRARED SENSING ELEMENT USING THE SAME THIN FILM

(75) Inventors: Kenji Nakanishi, Chiba; Hideo Nojima, Nara; Yasushi Ogimoto, Noda; Yoshihiro Takahashi, Kashiwa, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/342,079

(22) Filed: Jun. 28, 1999

(30) Foreign Application Priority Data

Jun. 29, 1998 (JP) .......................................... 10-181733
Jun. 16, 1999 (JP) .......................................... 11-169336

(51) Int. Cl.$^7$ ................................................ B05D 3/02
(52) U.S. Cl. ............................... 427/126.3; 427/376.2; 427/376.4
(58) Field of Search ................................ 428/468, 209, 428/469, 471, 472, 697, 699, 701, 702; 427/63, 126.3, 372.2, 374.1, 379, 376.2, 376.4; 505/160, 162

(56) References Cited

U.S. PATENT DOCUMENTS

| | | | |
|---|---|---|---|
| 5,514,484 A | * | 5/1996 | Nashimoto .................. 428/700 |
| 5,516,363 A | * | 5/1996 | Azuma et al. .......... 106/287.18 |
| 5,665,664 A | * | 9/1997 | Tomioka et al. ............. 501/152 |
| 5,977,017 A | * | 11/1999 | Golden ........................ 502/525 |
| 6,136,457 A | * | 10/2000 | Miyano et al. ............. 428/693 |
| 6,166,947 A | * | 12/2000 | Asamitsu et al. ............ 365/158 |

FOREIGN PATENT DOCUMENTS

| | | | |
|---|---|---|---|
| EP | 508893 A1 | * | 10/1992 |
| EP | 0710734 A1 | * | 5/1996 |
| JP | 405234800 A | * | 9/1993 |
| JP | 409059022 A | * | 3/1997 |
| JP | 2701477 B2 | * | 1/1998 |
| JP | 411183259 A | * | 7/1999 |

OTHER PUBLICATIONS

Tomioka et al. "Anomalous Magnetortransport Properties of Pr1–xCaxMnO3", Journal of the Physical Society of Japan, vol. 64, No. 10, Oct. 1995, pp. 3626–3630.*

Tomioka et al. "Magnetic–field–induced insulator phenomoena in Pr1–xCaxMnO3 with controlled charge–ordering instability", Physical Review B, vol. 53, No. 4, Jan. 15, 1996, pp. 106–109.*

"Metal–Insulator Transitions" ($2^{nd}$ ed.), written by Nevill F. Mott, translated by Ono and Otsuki and published by Maruzen In Japan, 1998, P. 210–212. No Month.

"Laser Ablated La1–xCaxMnO3 Thin Films", K. Hayashi and H. Wada; $2^{nd}$ Research Center, JDA. Extended Abstracts (The Autumn Meeting, 1997, of the Japan Society of Applied Physics), p. 593, No Month.

"Material Characteristics of Perovskite Manganese Oxide Thin Films for Bolometric Applications," Goyal, et al. *Appl. Phys. Lett.*, 71(17), Oct. 27, 1997, 1997 American Institute of Physics, P. 2535–2537.

* cited by examiner

*Primary Examiner*—Deborah Jones
*Assistant Examiner*—Stephen Stein
(74) *Attorney, Agent, or Firm*—David G. Conlin; John B. Alexander; Edwards & Angell, LLP

(57) ABSTRACT

A perovskite type manganese oxide thin film capable of working at temperatures within an electron cooling range and a high sensitivity infrared sensing element using the same thin film are disclosed. The thin film of perovskite type manganese oxide containing an element Ca or Sr and elements La, Mn and O is characterized in that a metal-insulation phase transition point of the thin film lies within a range of temperatures obtainable by a thermoelectric cooling method. The perovskite type manganese oxide is a thin film produced by a sol-gel method and the film is used for manufacturing an infrared sensing element.

8 Claims, 11 Drawing Sheets

THIN FILM OF PEROVSKITE TYPE MANGANESE OXIDE PROCESS FOR PRODUCING THE SAME THIN FILM AND AN INFRARED SENSING ELEMENT USING THE SAME THIN FILM

BACKGROUND OF THE INVENTION

The present invention relates to a thin-film of manganese oxide having a perovskite type crystal structure exhibiting metal-insulator phase transition and a process for producing the same thin film and also relates to a thermal type far-infrared sensor (bolometer) having high sensitivity and a wide band of effective wavelengths, which is produced by using the same thin-film material.

Materials having a large change in resistivity, which are well-known as metal-insulator phase transition (Physics of Metal and Non-metal (2nd ed.), written by Mott, translated by Ono and Otsuki and published by Maruzen in Japan, 1998) have been studied for possible various applications. Typical examples of those materials are high-temperature superconductors or transition metal oxides such as $V_2O_3$ and so on. The former has been developed for past ten several years to possess high quality and an improved transition range of 0.1K (90% of the temperature width from a maximal value to a least value in resistivity). However, a highest transition temperature is 136K for $HgBa_2Ca_2Cu_3O_y$, which is far from a room temperature. The latter include $V_2O_3$ doped with Cr by 1%, which has a transition temperature close to a room temperature and exhibits a change of 2 orders of magnitude in resistivity. However, the transition is first-order and has a large hysteresis.

A thermal far-infrared sensing element is one of the devices using material having a big change in resistivity at a phase transition point. Conventional infrared sensing elements that have been developed are classified mainly into quantum type elements and thermal type elements. The quantum type elements use inner quantum effects such as photoconductive effect, photoelectric effect and photomagnetic effect of semiconductors, while the thermal type elements are used for detection of a temperature change occurred by conversion infrared rays into heat energy. The infrared sensing elements are widely used for transmission of signals between electronic devices, detection of a human body, monitoring of food cooking temperatures, medical diagnostics, security and crime prevention systems, thermal management, volcano monitoring, earth environmental monitoring, resource investigation, space observation and so on. Recently, many studies have been actively conducted for application of a wavelength band from infrared to middle millimeter waves (ultra-far-infrared rays) for communications.

However, the above quantum type infrared sensing elements have a narrow usable wavelength band since a detectable infrared wavelength band is limited by a used semiconductor. For detecting a long far-infrared of about 10 microns in wavelength, it is necessary to reduce bandgap energy or impurity ionization potential of the semiconductor used. Therefore, the sensing elements are required to be cooled down to the liquid helium temperature (4.2K) to prevent the increase of carriers that may be produced in a semiconductor from thermal excitation. The thermal type sensing elements have wide effective wavelengths but low detection sensitivity.

Recently, there have been studied infrared sensing elements using insulator-metal phase transition (or semiconductormetal phase transition) of compound perovskite type structure manganese oxide (for example, p. 593, Extended Abstracts (The Autumn Meeting, 1997); The Japan Society of Applied Physics). The infrared sensing element of this type has a large figure of merit ($|d \log \rho/dT|$), where $\rho$ is electrical resistivity and T is absolute temperature, since the phase transition from insulator (or semiconductor) to metal can occur abruptly for a temperature change. Furthermore, it has a wide effective wavelength band relative to incident infrared radiation.

However, a normal compound perovskite type manganese oxide can maintain a large figure of merit merely within a low temperature range and has a decreased figure of merit at temperatures achieved by thermoelectric cooling means or at a room temperature. For example, a representative perovskite type manganese oxide $La_{0.7}Ca_{0.3}MnO_3$ has a merit figure of about $0.16K^{-1}$ at a temperature of 255K. A merit figure of manganese oxide $La_{0.7}Ba_{0.3}MnO_3$ having a transition point of 340K is decreased to 0.04 and a merit figure of manganese oxide $La_{0.7}Sr_{0.3}MnO_3$ having a transition 380K is decreased to 0.02.

SUMMARY OF THE INVENTION

An object of the present invention is to provide a thin film of manganese oxide, which has a metal-insulator phase transition obtainable at a higher temperature than i-conventional material and is based upon the inventor's studies on doping of the above material with carrier supplying alkali earth metals (such as Sr and Ca) and oxygen.

Another object of the present invention is to provide a process of producing the above manganese oxide thin-film.

Still another object of the present invention is to provide an infrared sensor made of the above manganese oxide thinfilm, which has the increased detection sensitivity and does not require cooling or requires a small cooling load.
Means for solving problems For accomplishing the above objects, inventors of the present invention have advanced studies on doping with alkali earth metals (Sr, Ca and so on) and oxygen, which are elements composing a perovskite type manganese oxide and supply with carriers and found thin film of perovskite type structure manganese oxide whose metal-insulator transition point obtainable within a very high temperature range.

The inventors have also found the fact that perovskite type manganese thin film prepared by a sol-gel process is given a higher phase transition temperature in comparison with a thin film prepared by an other method or has a metal-insulator transition range extended into a light dope side.

A thin film of perovskite type manganese oxide containing an element Ca or Sr and elements La, Mn and O, which is a first aspect of the present invention, is characterized in that a metal-insulation phase transition point of the thin film exists within a range of temperatures obtainable by a thermoelectric cooling method.

The range of thermoelectrically obtainable temperatures is a range of temperatures of −60° C. (low temperature) to room temperature that can be achieved by thermoelectric cooling method using a thermoelectric cooler such as a Peltier element.

A thin film of perovskite type manganese oxide containing an element Ca or Sr and elements La, Mn and O, which is a second aspect of the present invention, is characterized in that an oxygen component ratio is homogeneous in the film owing to inhibition of diffusion of oxygen elements.

A thin film of perovskite type manganese oxide whose composition is expressed as $La_{1-x}Ca_xMnO_{3+\delta}$ and which is a third aspect of the present invention, is characterized in that the Ca-component ratio x lies in a range of 0.1–0.2 and metal-to-insulator phase transition can occur within a temperature range obtained by thermoelectrically cooling method. The film thus constructed can work effectively at a room temperature or with a Peltier cooler having a small cooling load. The use of this film can create a high sensitivity infrared sensor having a high figure of merit.

A thin film of perovskite type manganese oxide whose composition is expressed as $La_{1-x}Ca_xMnO_{3+\delta}$ and which is a fourth aspect of the present invention, is characterized in that the film has Ca component ratio x of 0.1 to 0.5 and the oxygen-component ratio (3+δ) is controlled to cause metal-to-insulator phase transition to occur in a range of thermoelectrically obtainable temperatures.

A thin film of perovskite type manganese oxide whose composition is expressed as $La_{1-y}Sr_yMnO_{3+\delta}$ and which is a fifth aspect of the present invention, is characterized in that Sr-component ratio y exists within a range of 0.05–0.185 and the metal-to-insulator transition can occur therein at temperatures obtainable by a thermoelectric cooling method.

A thin film of perovskite type manganese oxide whose composition being expressed as $La_{1-y}Sr_yMnO_{3+\delta}$ and which is a sixth aspect of the present invention, is characterized in that the film having Sr-component ratio within a range of 0.185 to 0.25 is free from the occurrence therein structure phase transition.

A thin film of perovskite type manganese oxide, which is a seventh aspect of the present invention, is characterized in that the thin film is prepared by a sol-gel method. The thin film prepared by the above method can effectively work at a room temperature or by cooling with a Peltier element having a small cooling load. The use of this film can produce an infrared sensor having high sensitivity at a low cost.

A thin film of perovskite type manganese oxide, which is an eighth aspect of the present invention, is characterized in that the thin film is prepared through a rapid thermal annealing step in a production process. The production process can be considerably shortened in time to effectively produce the same films at a reduced cost.

A process for production of a thin film of perovskite type manganese oxide containing an element Ca or Sr and elements La, Mn and O, which is a ninth aspect of the present invention and which film is of any of the first and second aspect of the present invention, is characterized in that a rapid thermal annealing process is conducted in an atmosphere containing at least excess oxygen. A further aspect of the present invention is a process for producing the above perovskite type manganese oxide thin-film, which is characterized by repeating the above rapid thermal annealing process plural times. Still further aspect of the present invention is a process for producing the perovskite type manganese oxide thin-film, which is characterized in that the rapid thermal annealing process is repeated plural times but a temperature of the second time process and thereafter is lower than that of the first time process. Another aspect of the present invention is a process for producing a perovskite type manganese oxide thin-film by using the rapid thermal annealing process, which is characterized by conducting the rapid thermal annealing process with a cooling rate of not more than 3° C./min.

Finally, it is possible to provide a high-sensitivity thermal (bolometer) type infrared sensor comprising a readout circuit and a sensing portion, wherein the sensing portion has as its bolometer film the thin film of perovskite type manganese oxide.

PREFERRED EMBODIMENT OF THE INVENTION

Embodiment 1

Figure 1:
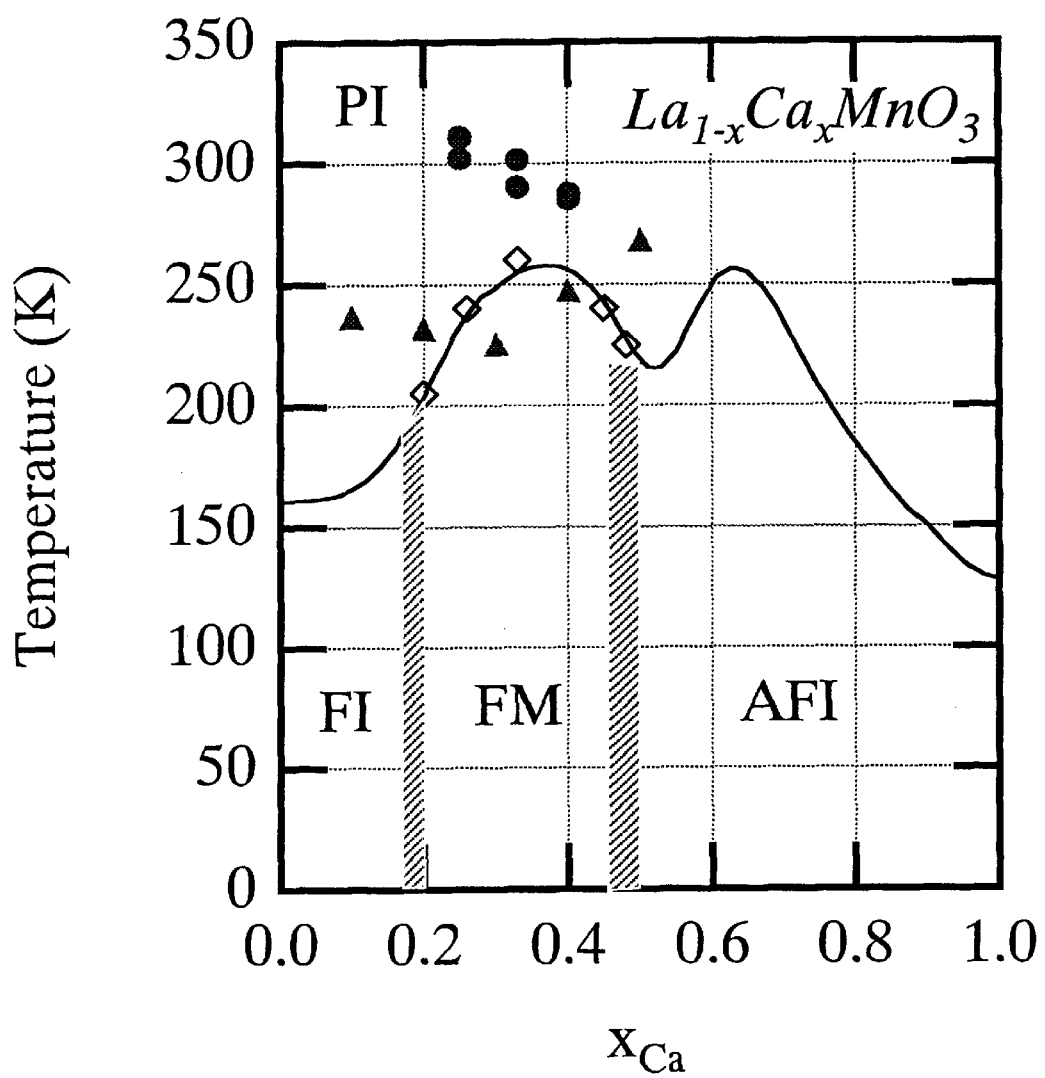
FIG. 1 is a graph showing a change of metal-insulator transition temperature Tc versus a change of Ca-component ratio x in thin films $La_{1-x}Ca_xMnO_3$ of the present invention in comparison with those of conventional bulk samples.

A first embodiment of the present invention is a method of producing a thin film of $La_{1-x}Ca_xMnO_3$ by a sol-gel process and features of the method. The film has the strict expression of its composition as $La_{1-x}Ca_xMnO_{3+\delta}$, where δ can attain a value within −0.1 to 0 depending upon desired conditions, but it is referred hereinafter to as $La_{1-x}Ca_xMnO_3$ for simplicity of the explanation.

Sol-gel solution is prepared by mixing, at desired ratios, coating agents such as lanthanum, calcium, manganese for MOD (Metal-organic deposition). The sufficiently homogeneous solution is applied by a spin coater onto an oxide substrate. As an insulating substrate is used material, e.g., $SrTiO_3(100)$ whose lattice constant and thermal expansion ratio are close to those of $La_{1-x}Ca_xMnO_3$. The substrate with a droplet of solution applied thereon is rotated at 500 rpm for 5 seconds, then at 2000 rpm for 20 seconds.

The substrate coated with the solution is dried in a dry oven, for example, at 120° C. for 10 minutes to remove solvent from the solution coat. Then, the substrate with a thin film formed thereon is heated on a hot plate, for example, at 430° C. for 10 minutes to remove organic components from the thin film of $La_{1-x}Ca_xMnO_3$.

On the substrate, a 100–300 nm thick noncrystal thin-film of $La_{1-x}Ca_xMnO_3$ is now prepared by the above process.

The process consisting of spin coating, drying and temporary sintering may be repeated until the thin film attains a desired thickness.

The noncrystal thin-film of $La_{1-x}Ca_xMnO_3$ is annealed for crystallization by the RTA (Rapid Thermal Annealing) method. The RTA method can rapidly heat a sample (thin film) by using a heating lamp, assuring high-speed crystallization of the thin film with a uniformly crystallized surface. Temperature measurement is conducted by a pyrometer placed to measure a temperature at a plate center. The sample as being itself a transparent film-substrate is placed on a non-transparent substrate such as silicone wafer whose temperature is monitored.

An annealing chamber has a gas inlet and an exhaust port. The rate of gas flowing therein is controlled by a mass flowmeter. The exhaust port is provided with a pressure valve that is automatically open to exhaust gas when the pressure therein reaches 1 atmosphere or higher. The present invention used nitrogen suboxide ($N_2O$) as induced gas for creating in the annealing chamber an excess oxygen atmosphere in the annealing chamber so that the thin film of perovskite type manganese oxide may be crystallized by the RTA method with no lack of oxygen components.

The RTA process with an excess oxygen atmosphere for production of the thin film according to the second aspect of the present invention will be described in detail as follows:

As described before, the thin film is of $La_{1-x}Ca_xMnO_{3+\delta}$ in correct expression, where $\delta$ composing a part of oxygen element compounding ratio changes within $-0.1$ to $0$, and apt to be crystallized lacking in oxygen elements in particular under the high-temperature crystallizing condition. Therefore, it is very important to select a suitable kind of process gas to effectively induce oxygen elements into a film.

In the sol-gel method, a starting substance is of an amorphous state (gel) in which all components are uniformly coexist therein. Once the substance was heated up to a temperature higher than the crystallizing point, it rapidly develops the crystallizing process including nuclei creation and crystal growth. In this stage, oxygen elements are uniformly distributed in equilibrium with the growing atmosphere. However, in the following cooling stage, the oxygen elements get out of the equilibrium with the atmosphere and preferentially move through a surface, grain boundary and defects, resulting in nonuniform oxygen distribution. Therefore, the present invention restricts the oxygen movement within a shortest period in the cooling stage by adopting a rapid cooling process and a nitrogen substitution process. A desired thin film can be thus obtained.

Namely, the metal-insulator transition temperature of the substance is increased by inducing a possible large amount of oxygen into the substance in the crystallizing process in which oxygen elements can freely move therein. On completion of crystallization, the crystallized film substance is rapidly cooled by the rapid cooling process and the nitrogen substitution process to maximally shorten a period allowing contact of the film with oxygen so as to prevent the oxygen from ununiformly invading into the substance through the film surface, grain boundary and defects. This can produce the desired quality of the thin film.

Figure 3:
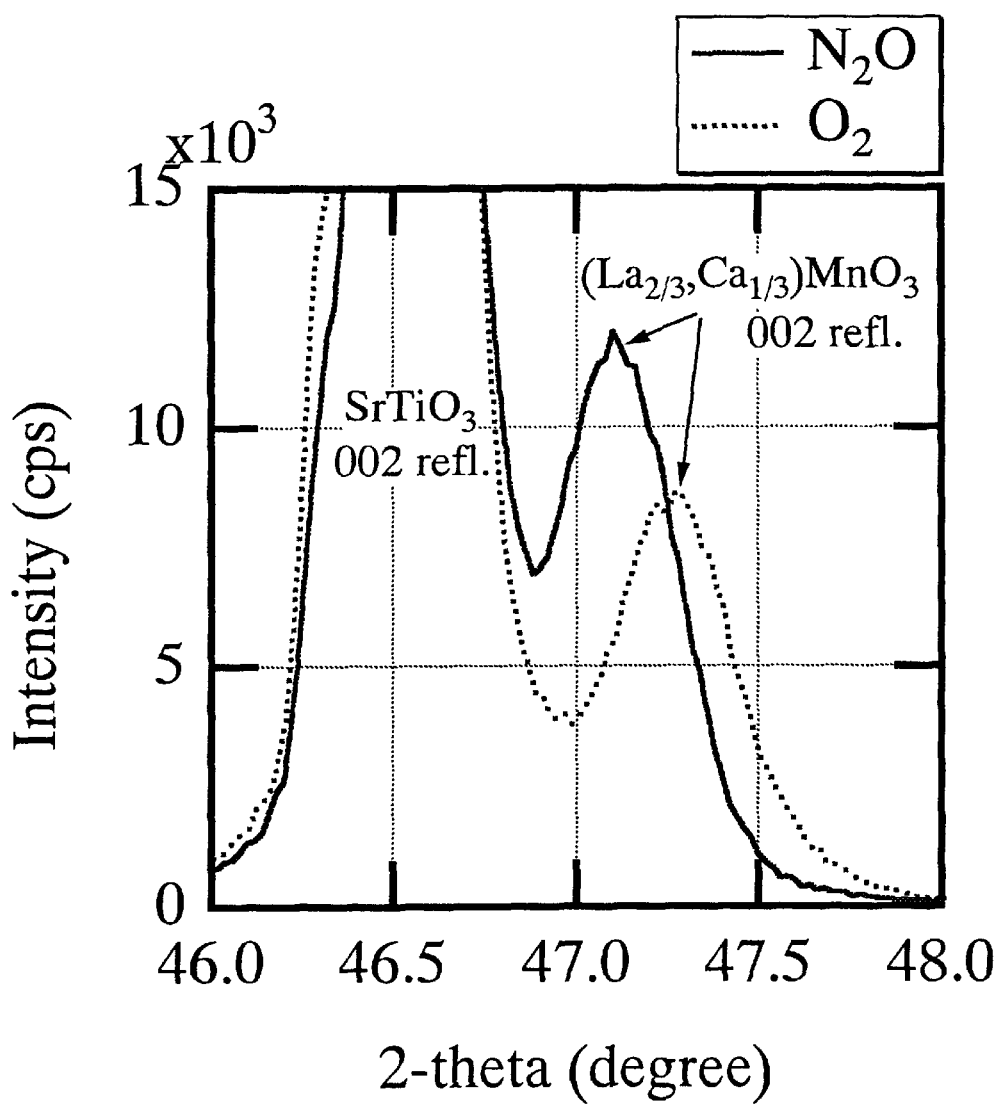
FIG. 3 is a graph showing the induced-gas dependency of X-ray diffraction intensities of thin films $La_{1-x}Ca_xMnO_3$ after crystallization annealing process.

$N_2O$ having a higher oxidizing ability than $O_2$ can prevent oxygen elements from escaping from the substance. The above effect is used to obtain a well-crystalline thin film by using $N_2O$ as process gas. This production example according to the present invention will be described as follows:

As shown in FIG. 3, the experiments have obtained the result showing that X-ray diffraction intensity of samples after crystallization annealing depends upon kinds of process gases. In different samples produced by respective annealing processes which have the same conditions excepting the use of different kinds of process gasses, X-ray diffraction analysis shows that $N_2O$ has a higher intensity than $O_2$ and forms an excellent crystalline structure of the sample. It is of course possible to use other kinds of process gases such as $O_3$, oxygen radical, $NO_2$ and so on.

The annealing process for crystallization of the thin film is as follows:

The thin film is rapidly heated from a room temperature to a specified highest temperature. For example, the film is heated up to 1000° C. at a temperature rising rate of +15° C./sec. The film is maintained at the highest temperature for 5 minutes, then the annealing oven is turned off and cooled down as it is. In the cooling stage, nitrogen gas is forcibly supplied into the oven to accelerate cooling of the sample since cooling speed may be decreased from 400° C. This causes the sample to gradually take therein oxygen elements, assuring the necessary composition ratio of oxygen in the sample.

Figure 4:
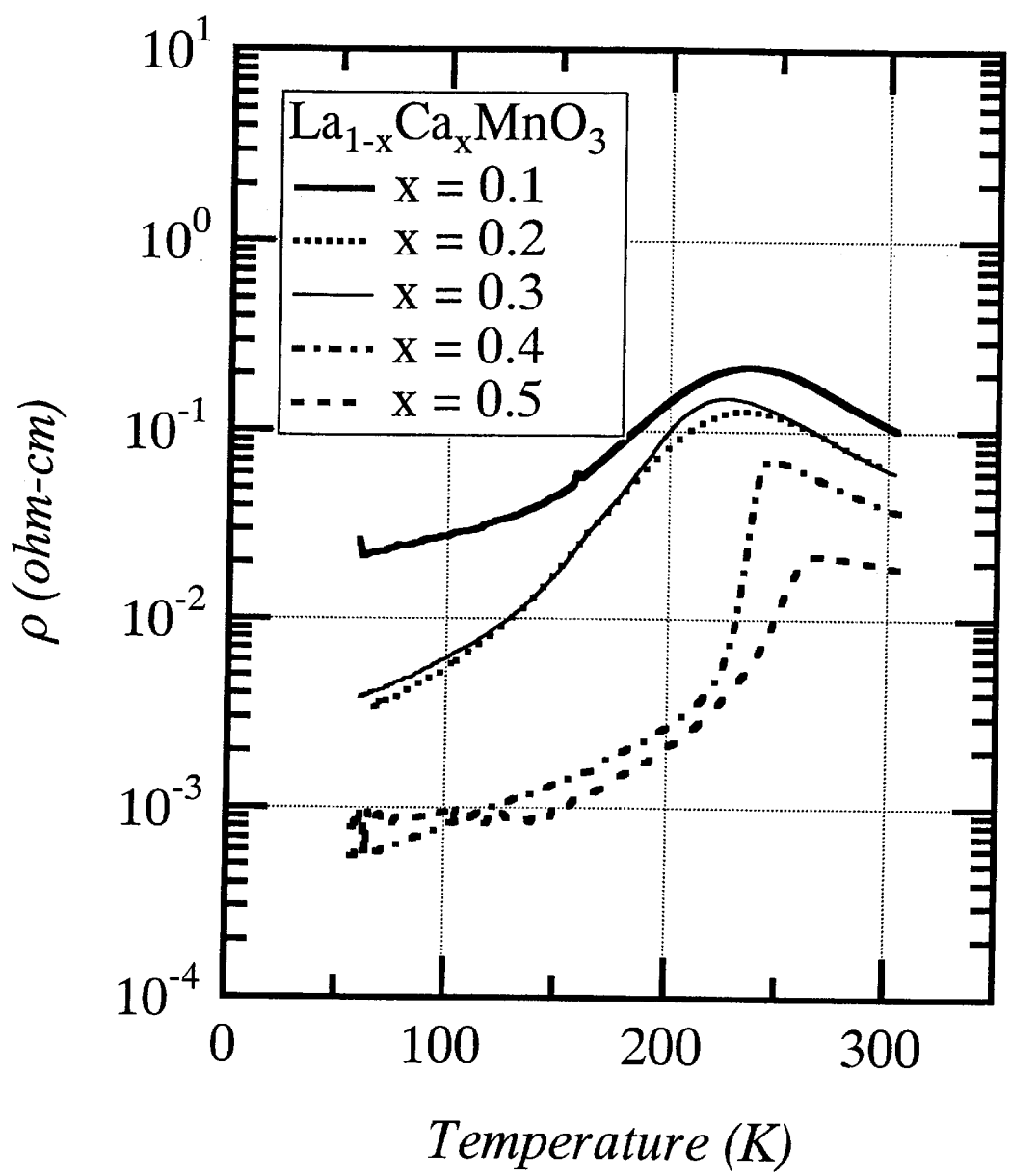
FIG. 4 is a graph showing the temperature dependency of the resistivity of thin films $La_{1-x}Ca_xMnO_3$ having different ratios of Ca component.

FIG. 4 is a graph showing the temperature dependency of the resistivity of the samples of $La_{1-x}Ca_xMnO_3$ which have different calcium (Ca) contents of 0.1 to 0.5. Each composition sample may have gradually increasing resistivity of metal on the low temperature side (200K or lower) at temperatures lower than 200K. Once the temperature exceeds 200K, the resistivity of the sample absurdly increases and causes the metal-insulator transition. After metal-insulator transition, the insulator has gradually degreasing resistivity. It should be noted that the above tendency is maintained even when x is 0.2 and 0.1.

Figure 5:
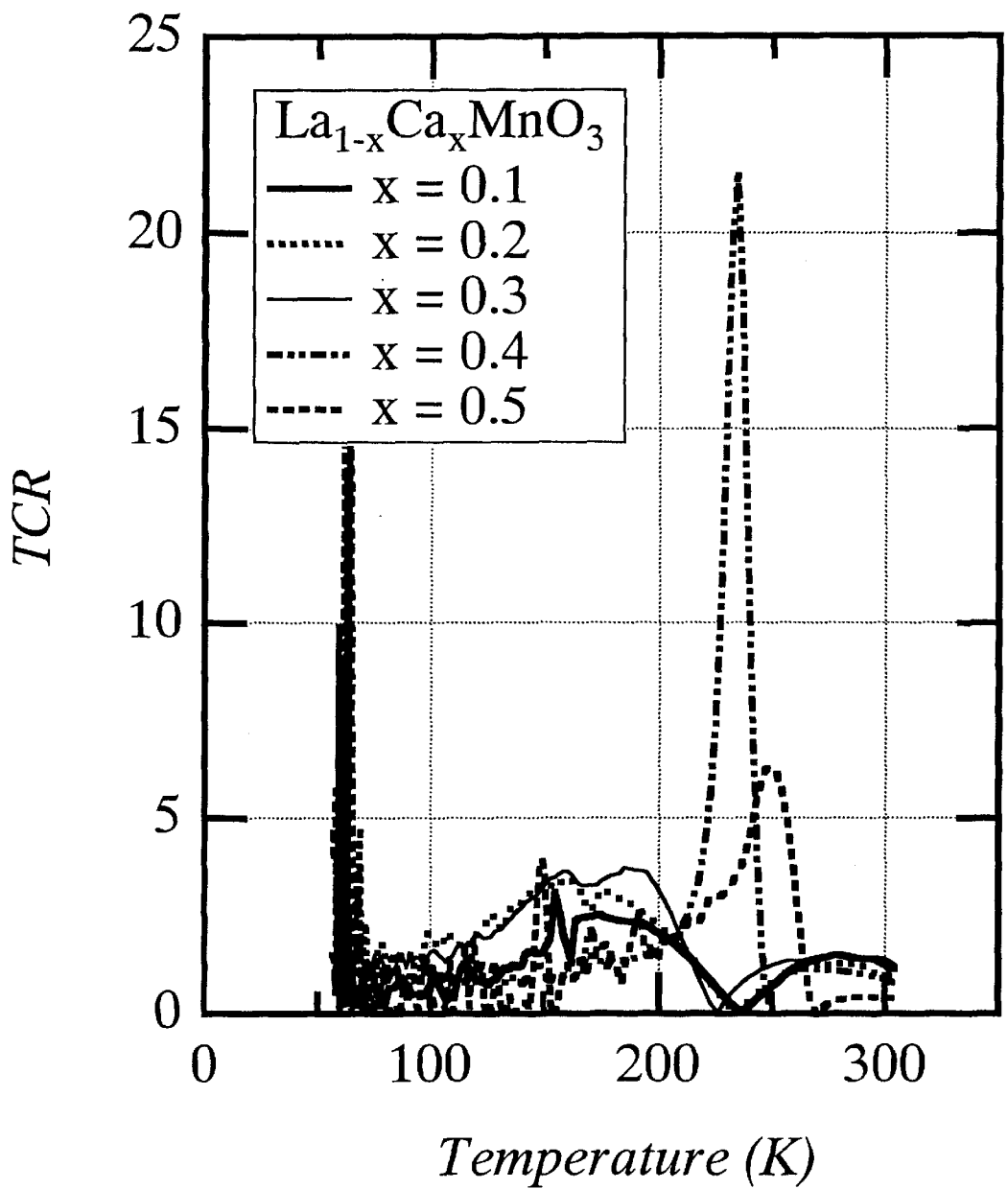
FIG. 5 is a graph showing the temperature dependency of the merit figure TCR (temperature coefficient of resistance) of thin films $La_{1-x}Ca_xMnO_3$ having different Ca-component ratio values.

FIG. 5 shows the temperature dependency of a merit figure TCR of the same composition samples. This value is proportional to a differential resistivity and, therefore, becomes maximal at the metal-insulator transition temperature. For example, the thin film of $La_{0.6}Ca_{0.4}MnO_3$ could obtain an increased merit figure TCR of not less than 20% at the metal-insulator transition point Tc of about 235K. The TCR value shown in FIG. 4 does not directly mean that only the sample having the calcium component ratio x of 0.4 has a particularly high composition dependency and therefore can achieve the excellent result. It should be understand that the best result was obtained by the sample having the calcium composition ratio x of 0.4 only in the shown manufacturing conditions. In other words, the sample having other Ca-component ratios may attain sufficient TCR values by optimally adapting manufacturing conditions.

Figure 6:
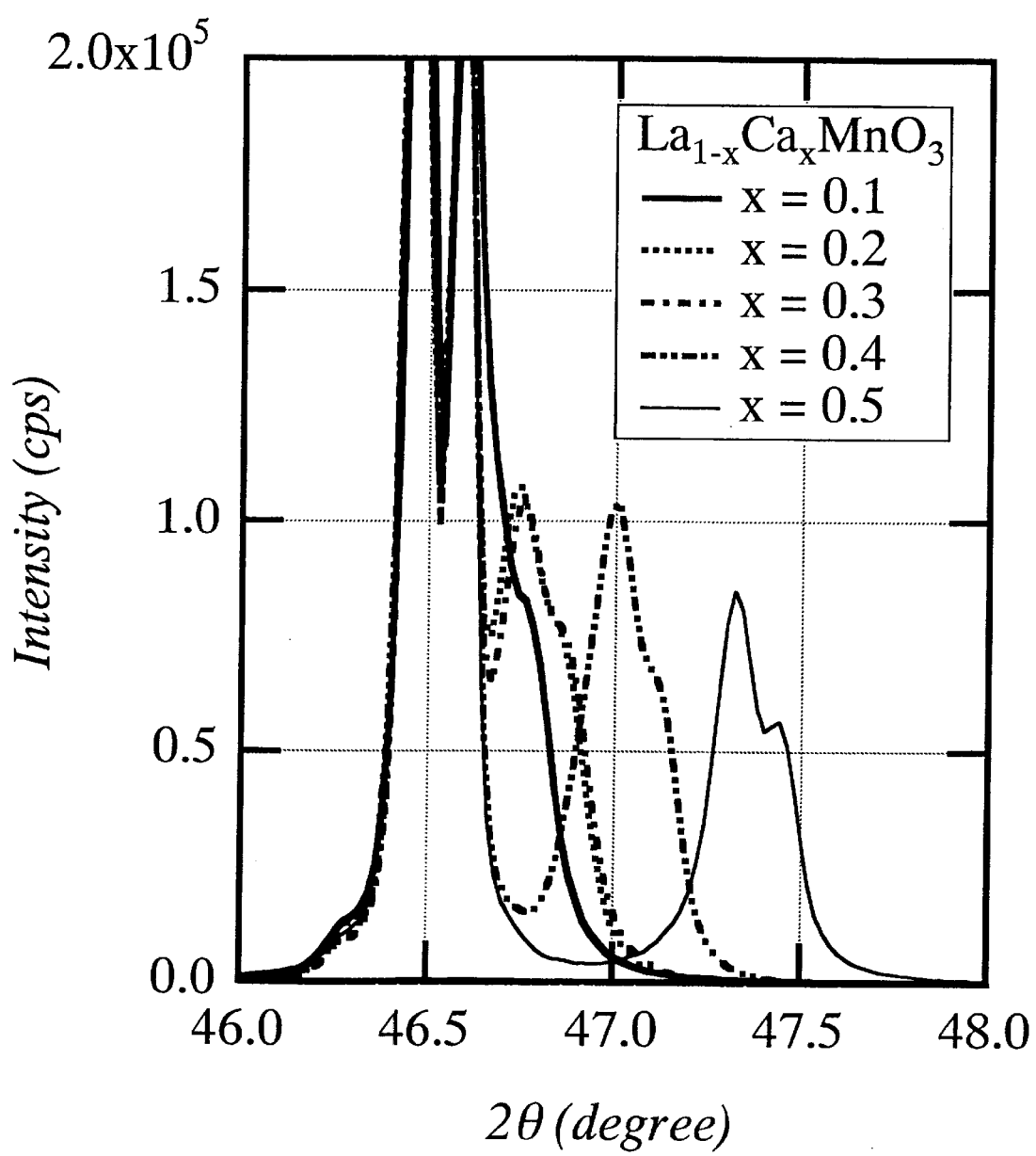
FIG. 6 is a graph showing a X-ray diffraction profile of thin films $La_{1-x}Ca_xMnO_3$ having different Ca component ratio values.

FIG. 6 shows X-ray diffraction profiles of the same composition samples using 002-reflection. It can be seen that as Ca-component ratio x increases the peak of X-ray diffraction intensity shifts toward a higher angle side reducing the lattice constant. The chemical composition of each sample was determined by the inductively coupled plasma (ICP) spectroscopy. Namely, the thin film sample is solved in a mixture of nitric acid and hydrogen peroxide water and analyzed.

FIG. 1 shows the composition dependency of metal-insulator transition points (Tc) of a thin film of $La_{1-x}Ca_xMnO_3$, in comparison with that of the conventional samples. A curve shows the component dependency of magnetic transition points (Curie point and Neel point) of a conventional bulk sample. White lozenges denote the composition dependency of metal-insulator transition point (Tc) of the conventional samples. In FIG. 1, the conventional sample test results show that magnetic transition point and metal-insulator transition point (Tc) have respective maximal values when x is about 1/3.

The perovskite type manganese oxide thin-film samples crystallized at the maximal annealing temperature of 1000° C. according to the present invention could have the metal-insulator transition point (Tc) which, as represented by black triangles in FIG. 1, monotonously increases until x reaches 0.5. This may be explained by the fact that the samples subjected by rapid cooling have a decreased oxygen amount in comparison with the conventional samples and therefore the amount of doping carriers in the samples was optimally regulated by using the calcium dopant.

In contrast to the conventional samples whose ferromagnetic metal phase (FM) disappears and transits into insulator phase (FI or PI) when x decreased less than 0.2, the samples of the present invention show the metal-insulation phase transition even when x is equal to 0.1. As is apparent from the x-ray diffraction analysis result, the crystal lattice of the thin film is deformed to tetragonal system which may be resulted from having been stretched inwardly in a plane by the effect of its substrate having a large crystal lattice.

Namely, the thin film according to the present invention in comparison with the conventional bulk sample has a widened range of Ca-component ratio values allowing metal-to-insulator phase transition to occur in the film substance. It was proved that the metal-to-insulator phase transition could take place in all samples having Ca-component values of 0.1 to 0.5 at transition temperatures Tc of −60° C. to 0° C. that could be obtained by thermoelectric cooling means (e.g., a Peltier element). Accordingly, the use of this thin film makes it possible to produce infrared sensing elements using the metal-insulator phase transition feature of the film substance by a simplified thermoelectric cooling method.

The perovskite type manganese oxide thin-film, which was produced by the same process as the above excepting a maximal temperature (900° C.) of crystallization annealing, has a widened range of Ca-component ratios x of 0.2 to 0.4 and a metal-insulator transition point Tc being higher than that of the conventional samples by 50K or less as shown black circles in FIG. 1. The film also attains an increased figure of merit TCR ($=|d \log \rho/dT|$) higher than that of the conventional samples by 3% or more.

Embodiment 2

Figure 7:
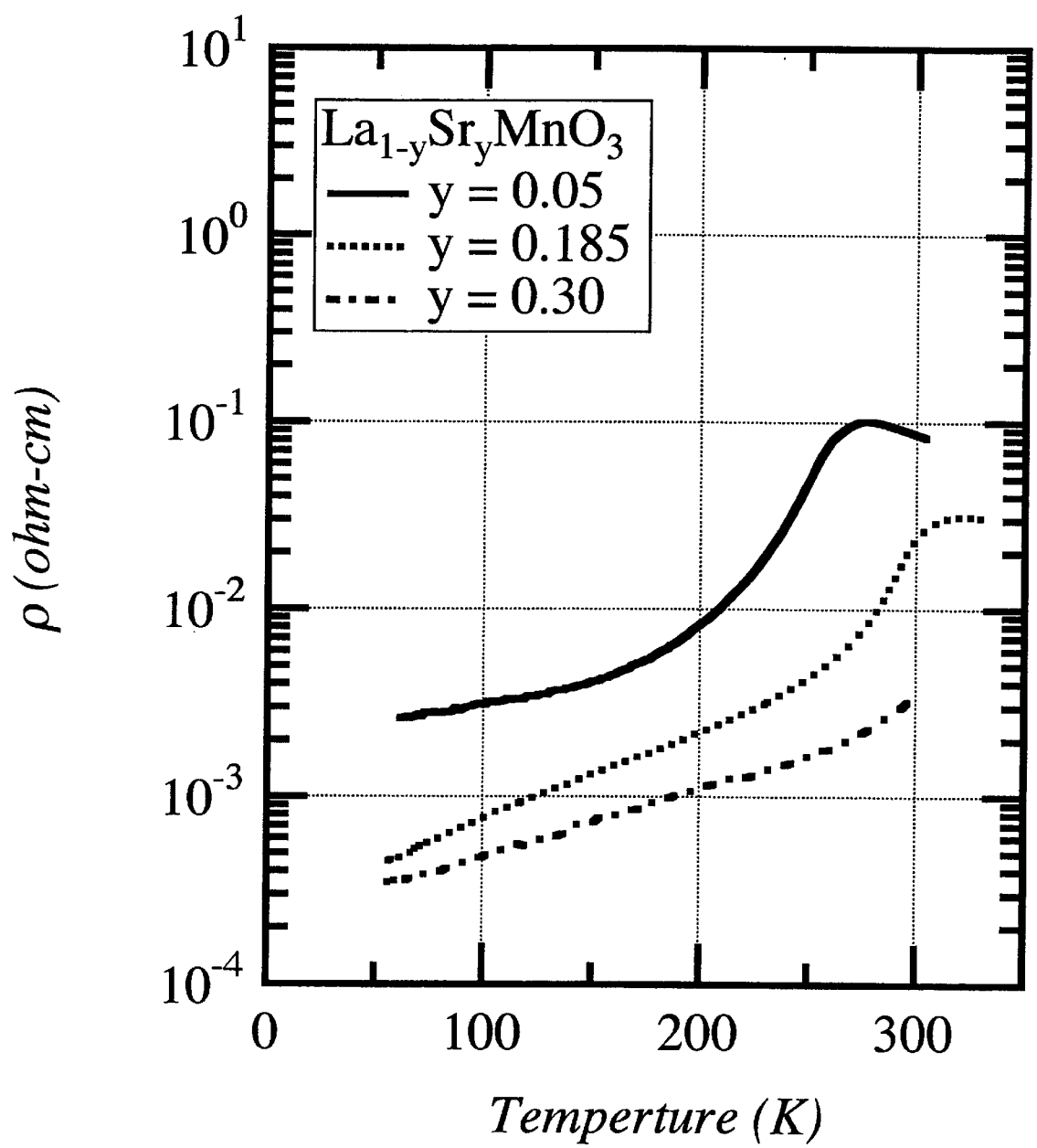
FIG. 7 is a graph showing the temperature dependency of the resistivity of thin films $La_{1-y}Sr_yMnO_3$ having different Sr-component ratio values.
Figure 8:
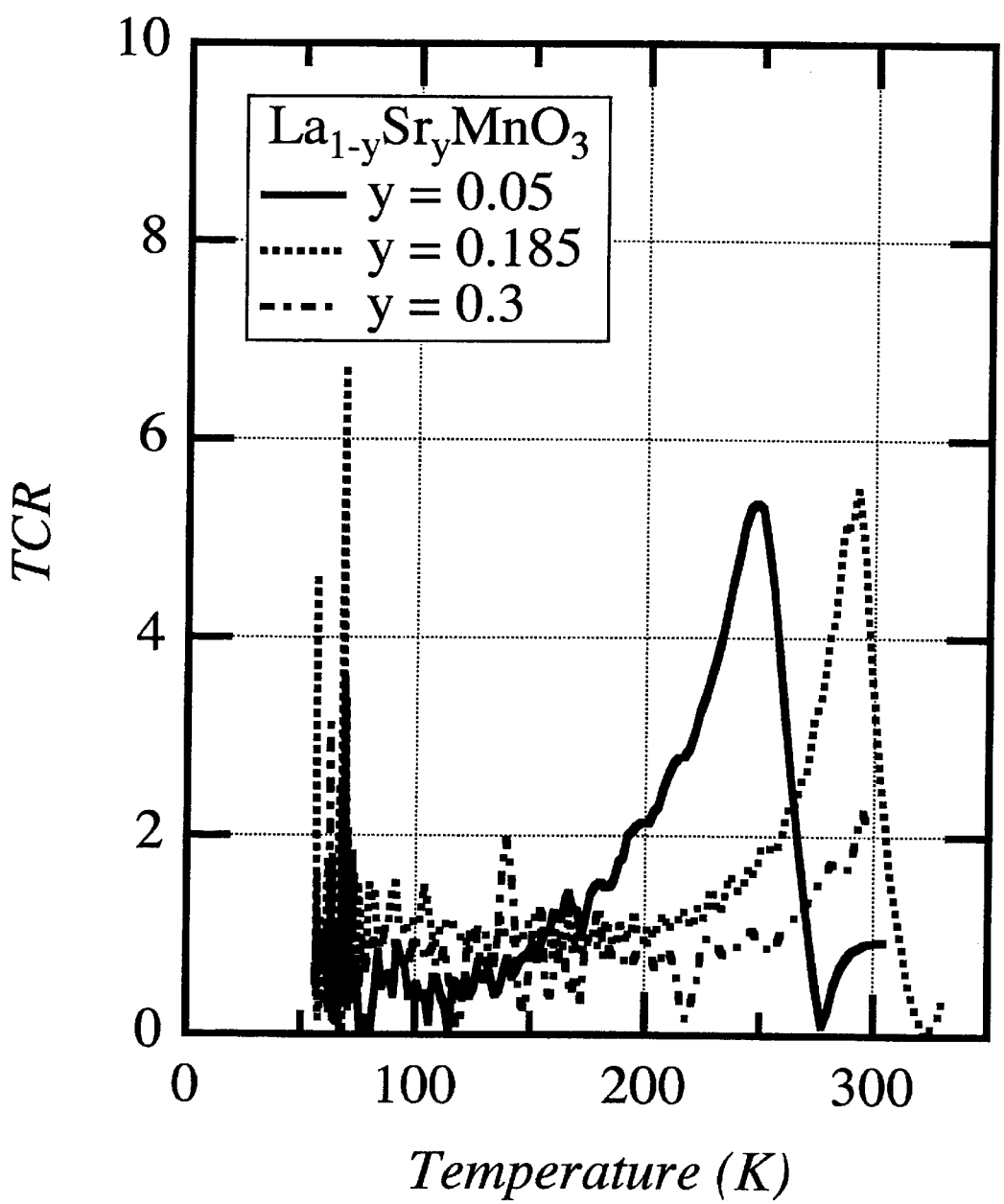
FIG. 8 is a graph showing the temperature dependency of the merit figure TCR of thin films $La_{1-y}Sr_yMnO_3$ having different Sr component ratio values.

Referring to FIGS. 7 and 8, another thin-film sample of $La_{1-y}Sr_yMnO_3$ produced by a process being similar to the process described for the first embodiment except for using Sr (in replace of Ca) as the carrier dopant will be described as follows:

The accurate expression of the sample is $La_{1-y}Sr_yMnO_{3+\delta}$ where $\delta$ is within −0.1 to 0.

Figure 2:
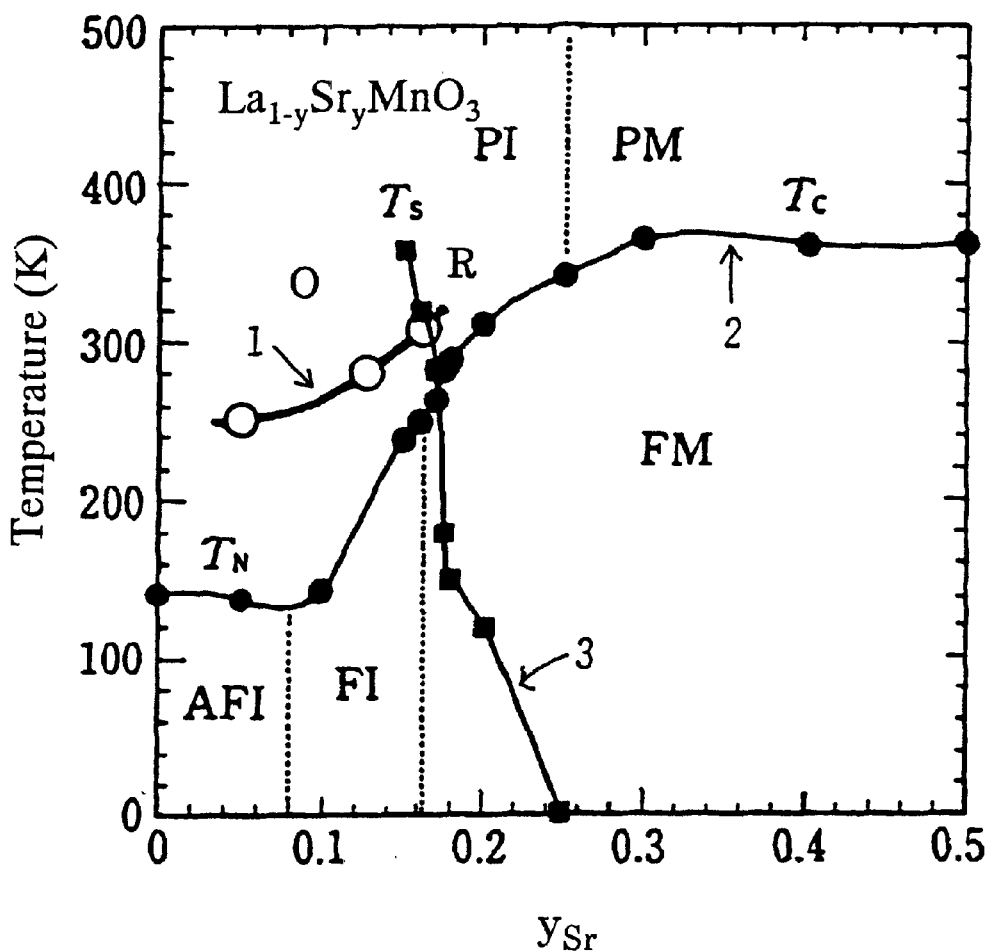
FIG. 2 is a graph showing a change of metal-insulator transition temperature Tc versus a change of Sr-component ratio y in thin film $La_{1-y}Sr_yMnO_3$ of the present invention in comparison with those of the conventional bulk samples.

FIG. 7 shows the temperature dependency of resistivity of the samples having different values y=0.05, 0.185 and 0.3 respectively. Similarly to the case of FIG. 4, the resistivity of each metal-phase sample increases gradually as temperature rises in the low temperature range and then abruptly increases at and after the metal-insulator transition point. The metal-to-insulator transition is also observed even at y=0.05. FIG. 8 shows the temperature dependency of the merit figures TCR of the samples having the same composition. FIG. 2 shows the comparison of the Sr-component dependency of the metal-insulator phase transition point of the samples with those of the conventional samples. In FIG. 8, it can be recognized that the sample $La_{1-y}Sr_yMnO_3$ can show a TCR value higher than 5% within a range of Sr-component ratio values y of 0.05 to 0.3. In particular, the sample having y=0.185 attains an excellent TCR value 5.5% at the temperature 290K close to the normal room temperature.

Referring to FIG. 2, the metal-insulator phase transition temperature curve 1 of the thin film of $La_{1-y}Sr_yMnO_3$ of the present invention is compared with the curve 2 of the conventional sample with bulk body.

In FIG. 2, AFI, FI and FM denote respectively an antiferromagnetic insulator, a ferromagnetic insulator and a ferromagnetic metal. PI and PM denote respectively a paramagnetic insulator and a paramagnetic metal. Tn and Tc denote respectively Neel temperature and Curie temperature. Ts shows a crystal structure transition point from orthorhombic phase (0-phase) to rhombohedral phase (R-phase).

For example, the conventional samples of $La_{1-y}Sr_yMnO_3$ have such metal-insulator phase transition points that insulator phase (FI or PI) is formed (i.e., no metal phase FM exists) when y is less than 0.185 while the samples of $La_{1-y}Sr_yMnO_3$ according to the present invention maintain the excellent metal phase when y is close to 0.05 and exhibit metal-to-insulator transition phase even when y is equal to 0.05. Furthermore, the samples of the present invention were proved to have metal-insulator transition points higher than those of the conventional samples by 100° C. or more. Namely, the thin film according to the present invention in comparison with the conventional bulk sample has a widened range of Sr-component ratio values allowing metal-to-insulator phase transition to occur in the film substance. It was proved that the metal-to-insulator phase transition could take place in all samples having Sr-component values of 0.05 to 0.185 at transition temperatures Tc of −60° C. to 0° C. that could be obtained by thermoelectric cooling means (e.g., a Peltier element). Accordingly, the use of this thin film makes it possible to produce infrared sensing elements using the metal-insulator phase transition feature of the film substance by a simplified production method.

The crystal structure of the above thin-film samples were analyzed by reciprocal lattice mapping method by X-ray diffraction with monochromated and parallel X-ray beam obtained through a 4-crystal type monochromator. The results show that all samples having different Sr-component ratios commonly exhibit a tetragonal system of crystals with lattices deformed by the binding effect of their substrates. The samples of the present invention do not show the crystal structure phase transition from the orthorhombic phase (O-phase) into the rhombohedral phase (R-phase), which could be observed in the conventional samples having Sr-component value y of 0.185 to 0.25 (as seen from the curve 3 plotted through points whereat the crystal structure transition occurred).

Namely, it was proven that the metal-insulator transition in the thin films according to the present invention is merely secondary and has no hysteresis produced by only spin in any component value.

Embodiment 3

Figure 9:
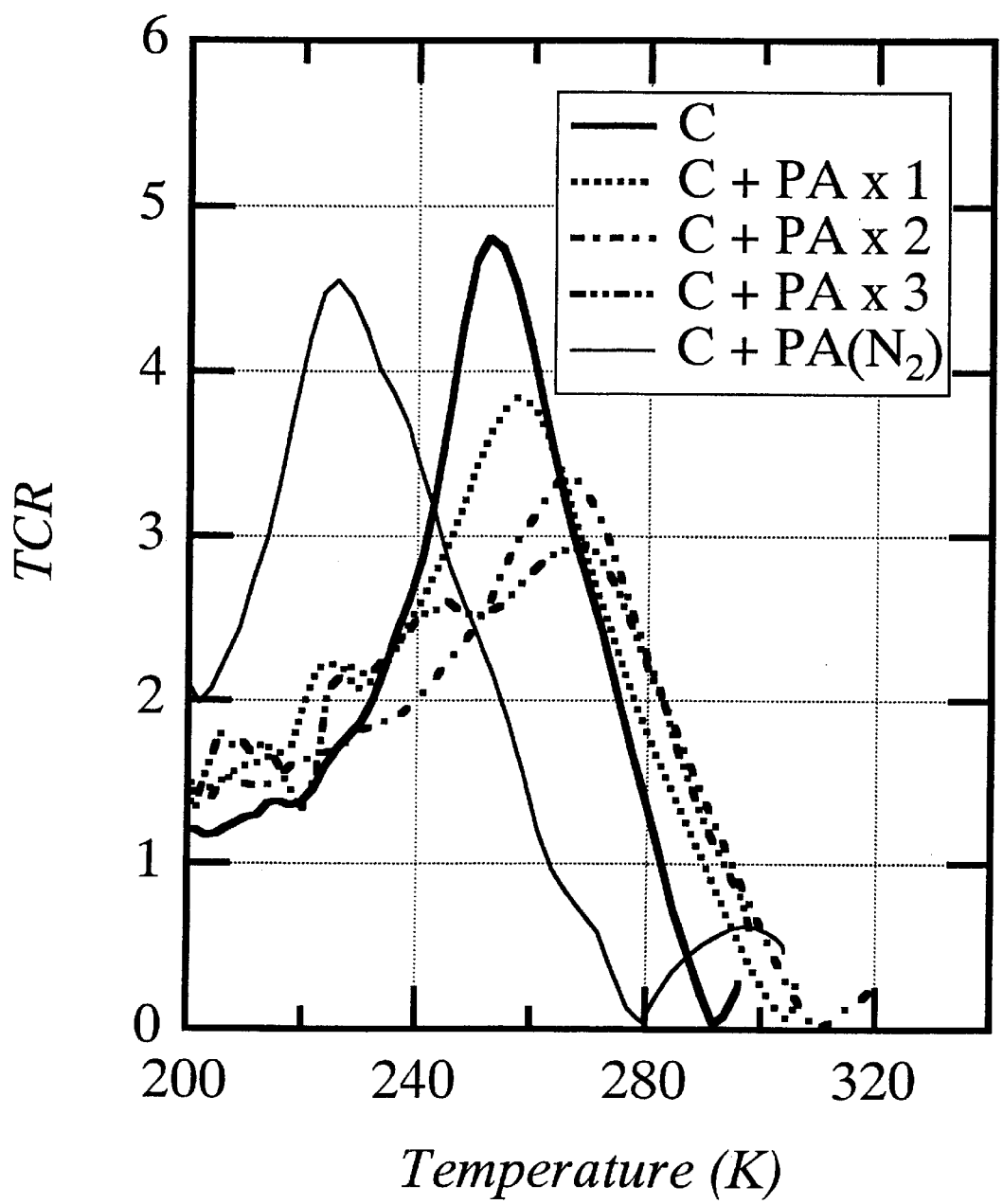
FIG. 9 is a graph showing a change of metal-insulator temperature Tp of thin films $La_{1-x}Ca_xMnO_3$ depending upon the number of repeating an oxygen annealing process.
Figure 10:
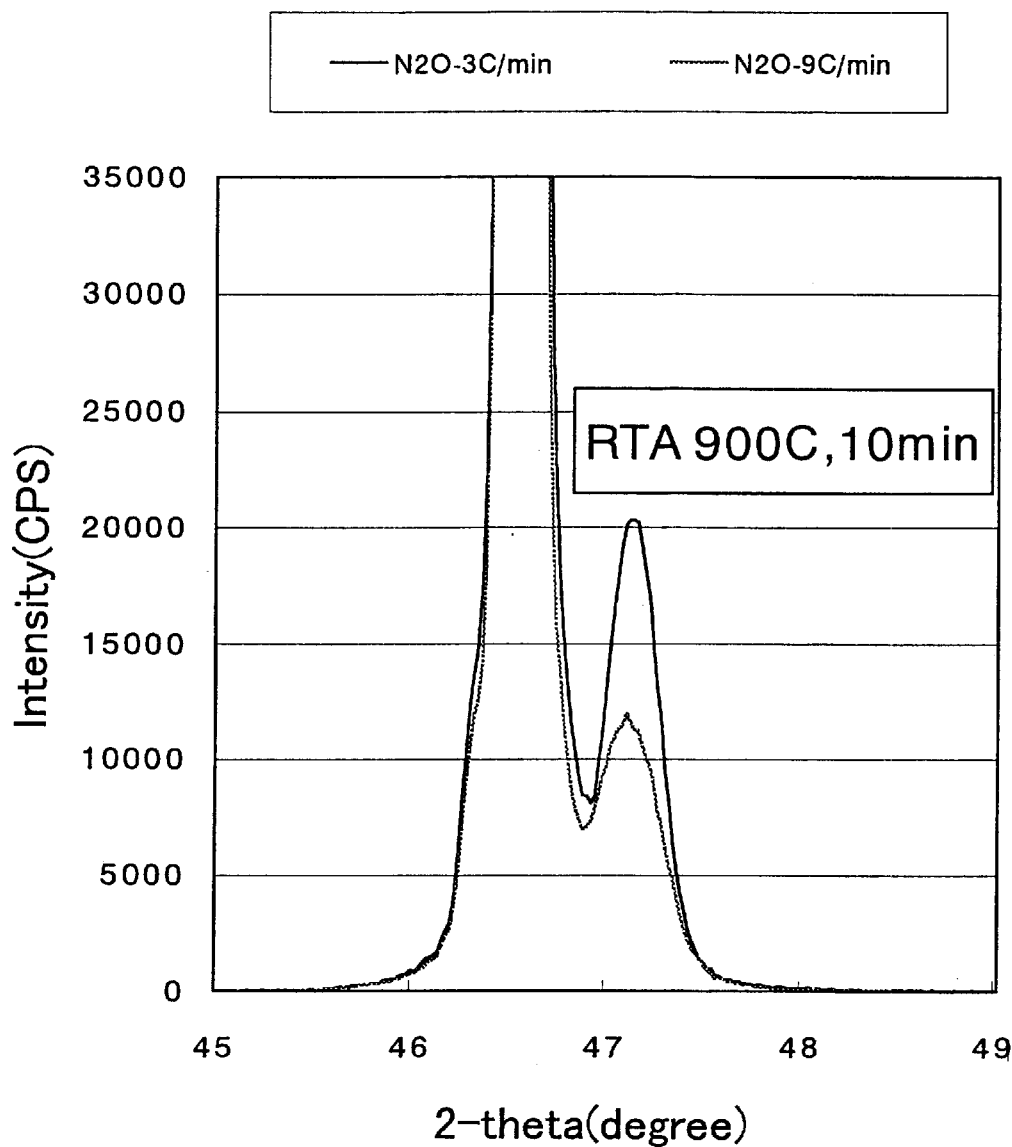
FIG. 10 is a graph showing X-ray diffraction intensities of samples annealed and cooled at different cooling temperature rate.

Referring to FIGS. 9 and 10, thin-film samples of $La_{1-x}Ca_xMnO_3$ (the third embodiment) prepared by a process that is similar to the process for the first embodiment excepting the crystallization annealing procedure will be described as follows.

The crystallization annealing process is dependent upon cooling speed. Namely, higher crystallization of the sample could be achieved by decreasing the cooling rate of the sample. For example, as shown in FIG. 10, the sample cooled at a rate of 3° C. per minute showed diffraction intensity twice higher than that of the sample cooled at a rate of 9° C. per minute. The thin-film samples thus produced by the present process achieved metal-insulator transition temperature Tp of about 290K measured just after the crystallization process. This shows that the sol-gel method is effective to increase the value Tp in comparison with thin-film of (La, Ca)MnO$_3$ formed by spattering of a sintered body, which has a metal-transition temperature Tp of about 240K.

The present invention conducted further heat treatment (hereinafter referred to as "oxygen annealing") of the thin-film samples by the RTA method. The samples were annealed in the atmosphere of induced gas N$_2$O at the maximum temperature of 800° C. for 10 minutes. FIG. 9 shows a change of the metal-insulator transition temperature Tp depending upon the number of times of the oxygen annealing. In this figure, C is the sample after only crystallization, and C+PAx1, C+PAx2, and C+PAx3 are the samples after crystallization and respectively one, two, and three times oxygen annealing (post-annealing). And the C+PA(N$_2$) is the sample after crystallization and one time annealing in the atmosphere of N$_2$. Prepeating the oxygen annealing process increased the transition temperature Tp (a temperature when TCR is O) up to about 310K.

Embodiment 4

A non-cooled type infrared sensor manufactured on a thin-film material produced by the second embodiment will be described below as a fourth embodiment of the present invention.

Figure 11:
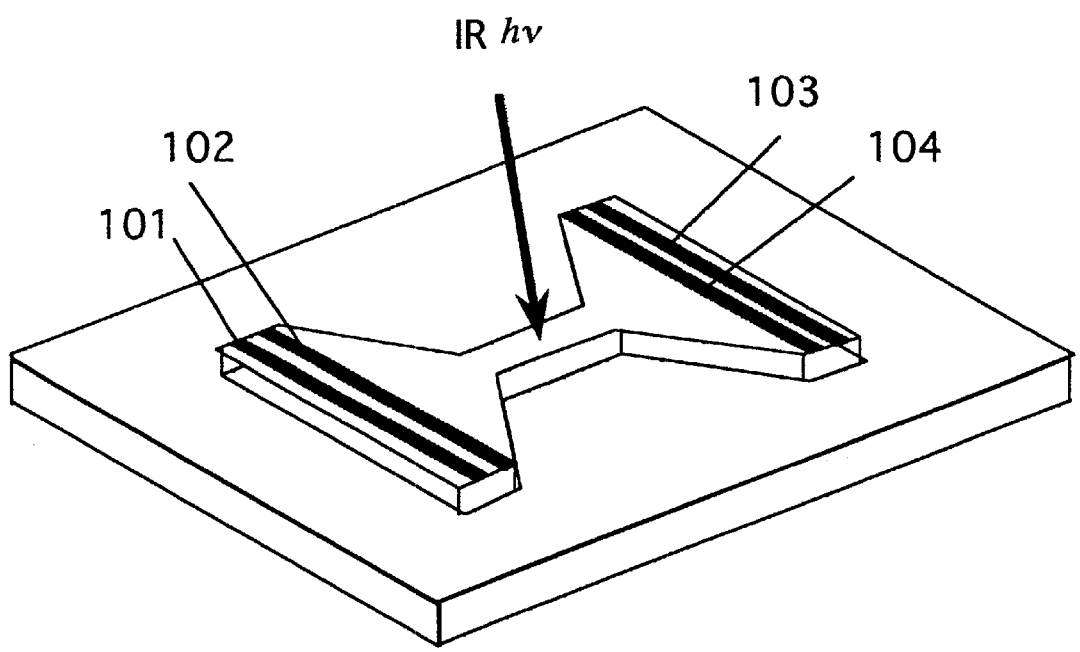
FIG. 11 is illustrative of an infrared sensing element according to the present invention.

Material La$_{0.7}$Sr$_{0.3}$MnO$_3$ was formed to a 200 nm thick thin film on a substrate and then protected with photoresist coated on a portion to be formed to an infrared sensing portion. The non-protected portion of the film was removed by argon (Ar) ion beams to form a bridge-shaped thin film having the bridge width of about 2 $\mu$m and length of about 30 $\mu$m as shown in FIG. 11. Finally, current and voltage electrodes of about 100 nm in thickness are formed on the bridge-shaped film by depositing silver material thereon with electron beams in an evacuated chamber.

The infrared sensor thus manufactured was tested for its performance at a working temperature of 20° C. The voltage was measured on the sensor by supplying a constant current 30 $\mu$A from a stabilized power source to the sensor's current electrode. The measurement result shows that the sensor has the voltage noise 80 nV/Hz$^{1/2}$ at the frequency of 10 Hz that corresponds to an equivalent noise electric power of 4×10$^{-11}$ W/Hz$^{1/2}$.

Embodiment 5

A electron cooling type infrared sensor manufactured on a thin-film of La$_{0.6}$Ca$_{0.4}$MnO$_3$ produced by the second embodiment process will be described below as a fifth embodiment of the present invention.

The infrared sensing element was manufactured in the same process as described above for the fourth embodiment excepting using the thin film La$_{0.6}$Ca$_{0.4}$MnO$_3$ instead of the thin film La$_{0.7}$Sr$_{0.3}$MnO$_3$ (the forth embodiment).

The performance of the infrared sensor thus manufactured was evaluated at the working temperature −40° C. by using a Peltier element for controlling an IR sensor temperature. The voltage was measured on the sensor by supplying a constant current 30 $\mu$A from a stabilized power source to the sensor's current electrode. The measurement result shows that the sensor has the voltage noise 23 nV/Hz$^{1/2}$ at the frequency of 10 Hz that corresponds to an equivalent noise electric power of 1×10$^{-11}$ W/Hz$^{1/2}$.

The advantages of the present invention are as follows.

The thin film of perovskite type manganese according to the present invention, can cause a large change in resistivity associated with an insulator-metal phase transition at a room temperature or a temperature obtained with a small load electron cooling mechanism. The film can also realize the compositional and crystalline homogenuity and improve the figure merit.

And the process for production of the thin film of perovskite type manganese according to the present invention, can easily realize the compositional and crystalline homogenuity of the film and improve the figure merit at a low cost.

Furthermore, the thermal type infrared sensors according to the present invention can detect incident IR radiation in wide effective waveband at a high sensitivity at a room temperature or a temperature obtained with a small load electron cooling mechanism by utilizing a large change in resistivity associated with transition from the insulator (or semiconductor) phase to the metal phase by the effect of incident infrared radiation. These infrared sensing elements possess high figures of merit can be used for realizing an infrared video information system that can be manufactured at a low cost by replacing an expensive optical element (germanium) with a plastic component and simplifying the element structure.

What is claimed is:

1. A method for obtaining a thin film of perovskite type manganese oxide containing an element Ca or Sr and the elements La, Mn and O and having a metal-to-insulator phase transition which occurs within a range of temperatures obtainable by a thermoelectric cooling method, the method comprising the steps of:

preparing a thin-film perovskite type manganese oxide containing La, Mn, O and either Ca or Sr by a sol-gel process; and controlling oxygen diffusion in a composition of the thin film in an atmosphere containing at least excess oxygen to obtain an even oxygen-component ratio in the film.

2. A method for obtaining a thin film of a perovskite type manganese oxide as defined in claim 1, wherein the thin film is prepared through a rapid thermal annealing process so that a metal-to-insulator phase transition occurs within a range of temperatures obtainable by a thermoelectric cooling method.

3. A method for producing a thin film of perovskite type manganese oxide as defined in claim 2, wherein the rapid thermal annealing process is conducted in an atmosphere containing at least excess oxygen so that a metal-to-insulator phase transition occurs within a range of temperatures obtainable by a thermoelectric cooling method.

4. A method for producing a thin film of perovskite type manganese oxide as defined in claim 3, wherein the rapid thermal annealing process is repeated plural times.

5. A method for producing a thin film of perovskite type manganese oxide as defined in claim 4, wherein the rapid thermal annealing process is repeated plural times by presetting a temperature of the second time process and thereafter lower than that of the first time process.

6. A method for producing a thin film of perovskite type manganese oxide as defined in claim 3, wherein the rapid thermal annealing process is conducted with a slow cooling rate of not more than 3° C./min.

7. A method for obtaining a thin film of a perovskite type manganese oxide exhibiting a metal-insulator phase transition which occurs within a range of temperatures obtainable by a thermoelectric cooling method as defined in claim 1, wherein the substance has the general formula, $AMnO_{3+\delta}$, wherein $\delta$ is from about −0.1 to about 0, A is a mixture of La and either Ca or Sr.

8. A method for obtaining a thin film of a perovskite type manganese oxide exhibiting a metal-insulator phase transition which occurs within a range of temperatures obtainable by a thermoelectric cooling method as defined in claim 1, wherein the temperature range is from about −60° C. to about room temperature.

* * * * *